United States Patent
Lin et al.

(10) Patent No.: US 7,929,658 B2
(45) Date of Patent: Apr. 19, 2011

(54) SHIFT REGISTER CIRCUIT HAVING BI-DIRECTIONAL TRANSMISSION MECHANISM

(75) Inventors: Chih-Lung Lin, Hsin-Chu (TW); Chun-Da Tu, Hsin-Chu (TW); Yung-Chih Chen, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 34 days.

(21) Appl. No.: 12/605,359

(22) Filed: Oct. 25, 2009

(65) Prior Publication Data

US 2011/0013740 A1    Jan. 20, 2011

(30) Foreign Application Priority Data

Jul. 14, 2009 (TW) ............................... 98123698 A

(51) Int. Cl.
*G11C 19/00* (2006.01)
(52) U.S. Cl. ................. 377/64; 377/69; 377/78; 377/79
(58) Field of Classification Search .................. None
See application file for complete search history.

(56) References Cited

U.S. PATENT DOCUMENTS

| | | | |
|---|---|---|---|
| 6,845,140 B2 | 1/2005 | Moon | |
| 7,057,598 B2 * | 6/2006 | Azami et al. | 345/100 |
| 7,120,221 B2 * | 10/2006 | Moon | 377/64 |
| 7,310,402 B2 | 12/2007 | Wei | |
| 7,366,274 B2 * | 4/2008 | Tseng et al. | 377/64 |
| 7,369,111 B2 * | 5/2008 | Jeon et al. | 345/100 |
| 7,450,681 B2 * | 11/2008 | Wei et al. | 377/64 |
| 7,831,010 B2 * | 11/2010 | Tobita | 377/64 |
| 2003/0128180 A1 | 7/2003 | Kim | |
| 2003/0189542 A1 | 10/2003 | Lee | |
| 2004/0190672 A1 * | 9/2004 | Lu et al. | 377/64 |
| 2006/0210012 A1 * | 9/2006 | Yamaguchi et al. | 377/64 |
| 2008/0258998 A1 | 10/2008 | Miyake | |
| 2009/0041177 A1 | 2/2009 | Chien | |

* cited by examiner

*Primary Examiner* — Tuan Lam
(74) *Attorney, Agent, or Firm* — Winston Hsu; Scott Margo

(57) ABSTRACT

A shift register includes a plurality of shift register stages for providing gate signals. Each shift register stage has a pull-up unit, a carry unit, a carry control unit, an input unit and a pull-down unit. The pull-up unit is employed to pull up a gate signal according to a driving control voltage and a first clock. The carry unit generates a preliminary start pulse signal based on the driving control voltage and the first clock. The carry control unit outputs the preliminary start pulse signal to become a forward or backward start pulse signal according to first and second bias voltages. The input unit is utilized for inputting a start pulse signal generated by a preceding or succeeding shift register stage to become the driving control voltage. The pull-down unit pulls down the gate signal, the preliminary start pulse signal and the driving control voltage according to multiple clocks.

22 Claims, 5 Drawing Sheets

SHIFT REGISTER CIRCUIT HAVING BI-DIRECTIONAL TRANSMISSION MECHANISM

BACKGROUND OF THE INVENTION

1. Field of the Invention

The present invention relates to a shift register circuit, and more particularly, to a Shift register circuit having bi-directional transmission mechanism.

2. Description of the Prior Art

Along with the advantages of thin appearance, low power consumption, and low radiation, liquid crystal displays have been widely applied in various electronic products for panel displaying. The operation of a liquid crystal display is featured by varying voltage drops between opposite sides of a liquid crystal layer for twisting the angles of the liquid crystal molecules in the liquid crystal layer so that the transmittance of the liquid crystal layer can be controlled for illustrating images with the aid of the light source provided by a backlight module. In general, the liquid crystal display comprises plural pixel units, a gate driver, and a source driver. The source driver is utilized for providing a plurality of data signals to be written into the pixel units. The gate driver comprises a shift register circuit for providing a plurality of gate signals to control related writing operations of the pixel units. That is, the shift register circuit is a crucial device for providing a control of writing the data signals into the pixel units.

FIG. 1 is a schematic diagram showing a prior-art shift register circuit 100. As shown in FIG. 1, the shift register circuit 100 includes a plurality of shift register stages. For ease of explanation, the shift register circuit 100 illustrates an (N−1)th shift register stage 111, an Nth shift register stage 112, and an (N+1)th shift register stage 113. The Nth shift register stage 112 is employed to generate a gate signal SGn and a start pulse signal STn according to a first clock CK1, a second clock CK2 and a start pulse signal STn−1. The gate signal SGn is furnished to a corresponding pixel unit 103 of a pixel array 101 via a gate line GLn for providing a control of writing the data signal of the data line DLi into the pixel unit 103. The start pulse signal STn is forwarded to the (N+1)th shift register stage 113 for enabling the (N+1)th shift register stage 113 to output a gate signal SGn+1 having high voltage level.

In the operation of the shift register circuit 100, the start pulse signal of each shift register stage is forwarded only to the succeeding shift register stage so that the gate signals having high voltage level can be outputted only based on unidirectional scan sequence, which is likely to incur an occurrence of mura effect on display screen. In other words, the prior-art shift register circuit 100 having unidirectional scan operation mode is unable to provide high display quality. For that reason, with the aim of suppressing the mura effect for enhancing display quality, how to build a shift register circuit having bi-directional gate signal scan operation has become one of the most important topics nowadays.

SUMMARY OF THE INVENTION

In accordance with an embodiment of the present invention, a shift register circuit having bi-directional transmission mechanism is disclosed for providing plural gate signals to plural gate lines. The shift register circuit comprises a plurality of shift register stages. An Nth shift register stage of the shift register stages comprises a pull-up unit, a carry unit, a carry control unit, an input unit, a control unit, a first pull-down unit, and a second pull-down unit.

The pull-up unit, electrically connected to an Nth gate line of the gate lines, is utilized for pulling up an Nth gate signal of the gate signals to a high voltage level according to a driving control voltage and a first clock. The Nth gate line is employed to deliver the Nth gate signal. The carry unit is employed to generate a preliminary start pulse signal according to the driving control voltage and the first clock. The carry control unit, electrically connected to the carry unit for receiving the preliminary start pulse signal, is put in use for outputting the preliminary start pulse signal to become the an Nth forward start pulse signal or an Nth backward start pulse signal according to a first bias and a second bias. The input unit, electrically connected to an (N−1)th shift register stage and an (N+1)th shift register stage of the shift register stages for receiving an (N−1)th forward start pulse signal and an (N+1)th backward start pulse signal respectively, is utilized for inputting the (N−1)th forward start pulse signal having high voltage level or the (N+1)th backward start pulse signal having high voltage level to become the driving control voltage. The control unit functions to generate a control signal according to the first clock, the Nth gate signal and the driving control voltage. The first pull-down unit, electrically connected to the control unit, the Nth gate line and the carry unit, is employed to pull down the Nth gate signal according to the control signal, a second clock, or a fourth clock. The first pull-down unit is also employed to pull down the preliminary start pulse signal according to the fourth clock. The second pull-down unit, electrically connected to the input unit and the Nth gate line, is utilized for pulling down the driving control voltage and the Nth gate signal according to a third clock.

In accordance with another embodiment of the present invention, a shift register circuit having bi-directional transmission mechanism is disclosed for providing plural gate signals to plural gate lines. The shift register circuit comprises a plurality of shift register stages. An Nth shift register stage of the shift register stages comprises a pull-up unit, a forward carry unit, a backward carry unit, an input unit, a control unit, a first pull-down unit, and a second pull-down unit.

The pull-up unit, electrically connected to an Nth gate line of the gate lines, is utilized for pulling up an Nth gate signal of the gate signals to a high voltage level according to a driving control voltage and a first clock. The Nth gate line is employed to deliver the Nth gate signal. The forward carry unit is employed to output a first signal to become an Nth forward start pulse signal according to the driving control voltage. The backward carry unit is employed to output a second signal to become an Nth backward start pulse signal according to the driving control voltage. The input unit, electrically connected to an (N−1)th shift register stage and an (N+1)th shift register stage of the shift register stages for receiving an (N−1)th forward start pulse signal and an (N+1)th backward start pulse signal respectively, is utilized for inputting the (N−1)th forward start pulse signal having high voltage level or the (N+1)th backward start pulse signal having high voltage level to become the driving control voltage. The control unit functions to generate a control signal according to the first clock, the Nth gate signal and the driving control voltage. The first pull-down unit, electrically connected to the control unit, the Nth gate line, the forward carry unit and the backward carry unit, is employed to pull down the Nth gate signal according to the control signal, a second clock, or a fourth clock. The first pull-down unit is also employed to pull down the Nth forward start pulse signal and the Nth backward start pulse signal according to the fourth clock. The second pull-down unit, electrically connected to the input unit and the Nth gate line, is utilized for pulling down the driving control voltage and the Nth gate signal according to a third clock.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, preferred embodiments of the present invention will be described in detail with reference to the accompanying drawings. Here, it is to be noted that the present invention is not limited thereto.

Figure 1:
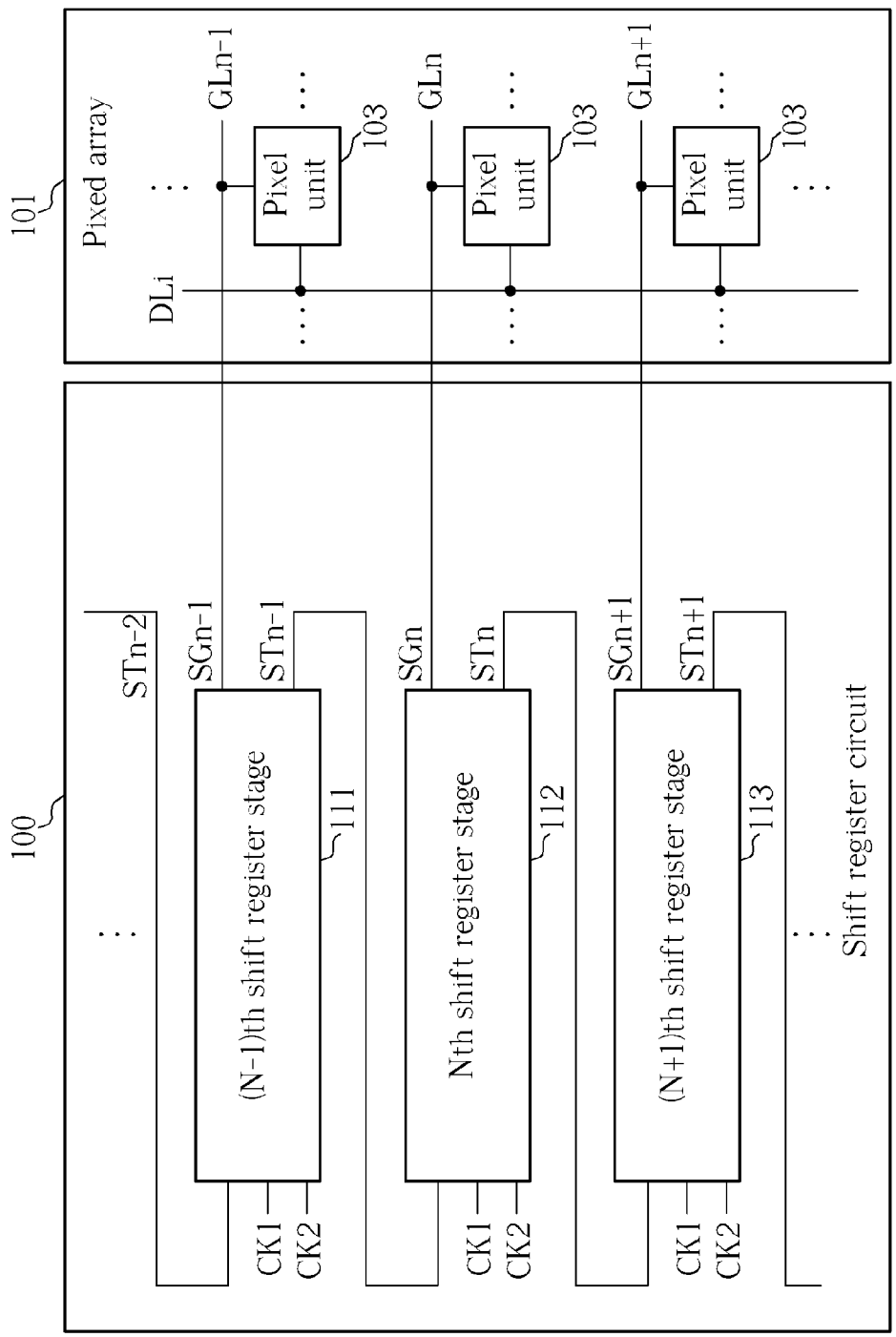
FIG. 1 is a schematic diagram showing a prior-art shift register circuit.
Figure 2:
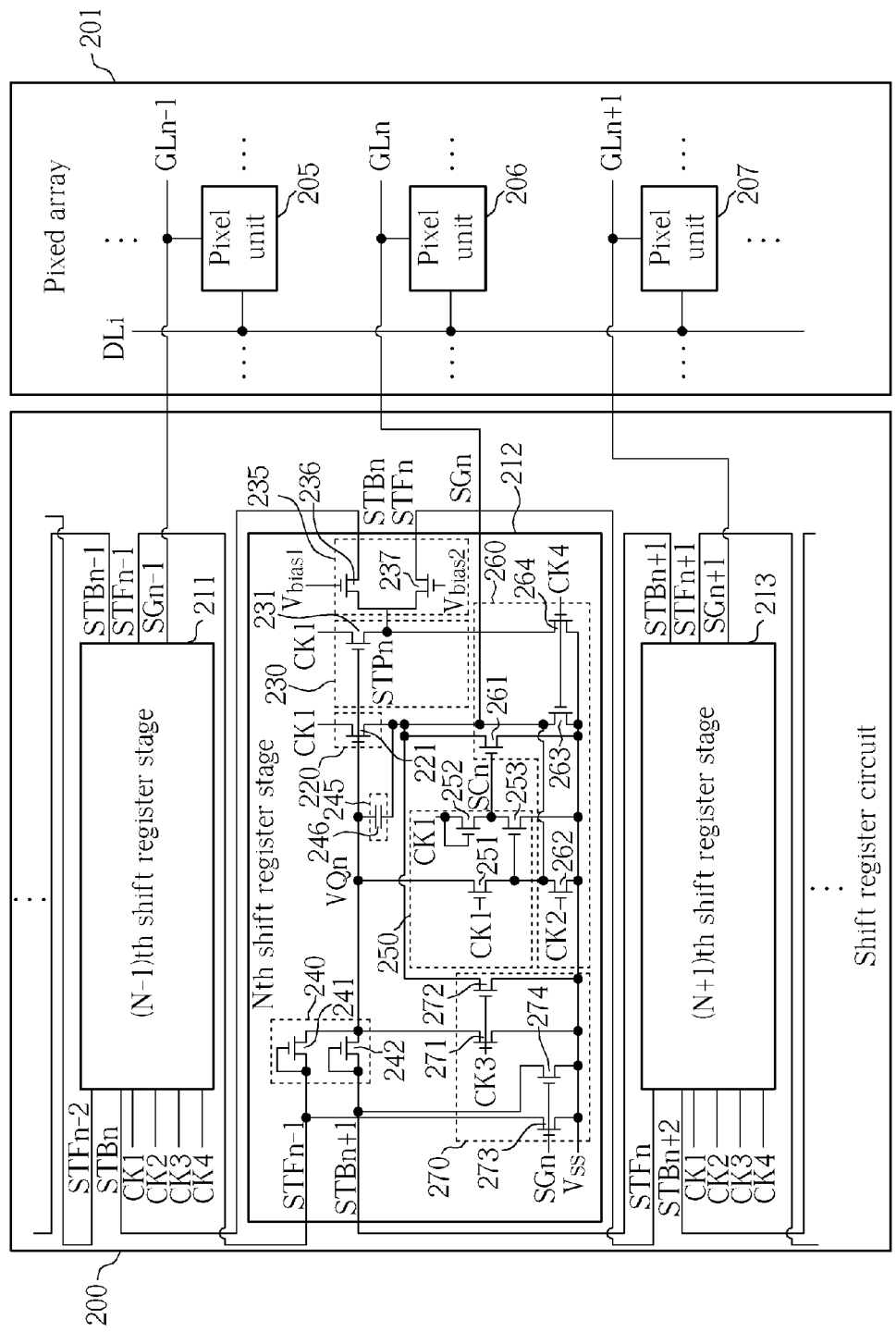
FIG. 2 is a schematic diagram showing a shift register circuit in accordance with a first embodiment of the present invention.

FIG. 2 is a schematic diagram showing a shift register circuit 200 in accordance with a first embodiment of the present invention. As shown in FIG. 2, the shift register circuit 200 comprises a plurality of shift register stages. For ease of explanation, the shift register circuit 200 illustrates an (N−1)th shift register stage 211, an Nth shift register stage 212, and an (N+1)th shift register stage 213. The number N is a positive integer. For the sake of brevity, only the internal structure of the Nth shift register stage 212 is exemplified in detail. The other shift register stages are similar to the Nth shift register stage 212 and can be inferred by analogy. The (N−1)th shift register stage 211 is employed to provide a gate signal SGn−1, a forward start pulse signal STFn−1 and a backward start pulse signal STBn−1. The Nth shift register stage 212 is employed to provide a gate signal SGn, a forward start pulse signal STFn and a backward start pulse signal STBn. The (N+1)th shift register stage 213 is employed to provide a gate signal SGn+1, a forward start pulse signal STFn+1 and a backward start pulse signal STBn+1. The circuit operation of each shift register stage is under the control of a first clock CK1, a second clock CK2, a third clock CK3 and a fourth clock CK4.

The gate signal SGn−1, furnished to the pixel unit 205 of a pixel array 201 via a gate line GLn−1, is employed to provide a control of writing a corresponding data signal of the data line DLi into the pixel unit 205. The gate signal SGn, furnished to the pixel unit 206 of the pixel array 201 via a gate line GLn, is employed to provide a control of writing a corresponding data signal of the data line DLi into the pixel unit 206. The gate signal SGn+1, furnished to the pixel unit 207 of the pixel array 201 via a gate line GLn+1, is employed to provide a control of writing a corresponding data signal of the data line DLi into the pixel unit 207. The forward start pulse signal generated by each shift register stage is employed to enable a succeeding shift register stage, e.g. the forward start pulse signal STFn generated by the Nth shift register stage 212 is employed to enable the (N+1)th shift register stage 213. The backward start pulse signal generated by each shift register stage is employed to enable a preceding shift register stage, e.g. the backward start pulse signal STBn generated by the Nth shift register stage 212 is employed to enable the (N−1)th shift register stage 211.

The Nth shift register stage 212 comprises a pull-up unit 220, an energy-store unit 245, an input unit 240, a carry unit 230, a carry control unit 235, a control unit 250, a first pull-down unit 260, and a second pull-down unit 270. The pull-up unit 220 is electrically connected to the gate line GLn and functions to pull up the gate signal SGn of the gate line GLn based on a driving control voltage VQn and the first clock CK1. The input unit 240 is electrically connected to the (N−1)th shift register stage 211 and the (N+1)th shift register stage 213 for receiving the forward start pulse signal STFn−1 and the backward start pulse signal STBn+1 respectively. The input unit 240 inputs the forward start pulse signal STFn−1 having high voltage level or the backward start pulse signal STBn+1 having high voltage level to become the driving control voltage VQn. The energy-store unit 245, electrically connected to the pull-up unit 220, the input unit 240 and the carry unit 230, is utilized for providing the driving control voltage VQn to the pull-up unit 220 and the carry unit 230 through performing a charging process based on the forward start pulse signal STFn−1 or the backward start pulse signal STBn+1. The carry unit 230, electrically connected to the input unit 240 and the energy-store unit 245, is employed to generate a preliminary start pulse signal STPn according to the driving control voltage VQn and the first clock CK1. The carry control unit 235, electrically connected to the carry unit 230 for receiving the preliminary start pulse signal STPn, is utilized for outputting the preliminary start pulse signal STPn to become the forward start pulse signal STFn or the backward start pulse signal STBn under the control of a first bias Vbias1 and a second bias Vbias2.

The control unit 250 is electrically connected to the energy-store unit 245 and functions to generate a control signal SCn according to the first clock CK1, the gate signal SGn and the driving control voltage VQn. The first pull-down unit 260, electrically connected to the control unit 250, the gate line GLn and the carry unit 230, is used to pull down the gate signal SGn to a low power voltage Vss according to the control signal SCn, the second clock CK2 or the fourth clock CK4. The first pull-down unit 260 is also used to pull down the preliminary start pulse signal STPn to the low power voltage Vss according to the fourth clock CK4. The second pull-down unit 270, electrically connected to the input unit 240 and the gate line GLn, is utilized for pulling down the driving control voltage VQn and the gate signal SGn to the low power voltage Vss according to the third clock CK3. The second pull-down unit 270 is also utilized for pulling down the forward start pulse signal STFn−1 and the backward start pulse signal STBn+1 to the low power voltage Vss according to the gate signal SGn.

In the embodiment shown in FIG. 2, the pull-up unit 220 comprises a first transistor 221, the input unit 240 comprises a second transistor 241 and a third transistor 242, the energy-store unit 245 comprises a capacitor 246, the carry unit 230 comprises a fourth transistor 231, the carry control unit 235 comprises a fifth transistor 236 and a sixth transistor 237, the control unit 250 comprises a seventh transistor 251, an eighth transistor 252 and a ninth transistor 253, the first pull-down unit 260 comprises a tenth transistor 261, an eleventh transistor 262, a twelfth transistor 263 and a thirteenth transistor 264, and the second pull-down unit 270 comprises a fourteenth transistor 271, a fifteenth transistor 272, a sixteenth transistor 273 and a seventeenth transistor 274. The first transistor 221 through the seventeenth transistor 274 are thin film transistors, metal oxide semiconductor (MOS) field effect transistors, or junction field effect transistors.

The second transistor 241 comprises a first end for receiving the forward start pulse signal STFn−1, a gate end electrically connected to the first end, and a second end electrically connected to the capacitor 246. The third transistor 242 comprises a first end for receiving the backward start pulse signal STBn+1, a gate end electrically connected to the first end, and a second end electrically connected to the second end of the second transistor 241. The circuit functionality of the second transistor 241 is actually similar to a diode. Accordingly, the first and second ends of the second transistor 241 are equivalent respectively to the anode and cathode of a diode. In view of that, the second transistor 241 is turned on by the forward start pulse signal STFn−1 having high voltage level for passing the forward start pulse signal STFn−1 to become the driving control voltage VQn; alternatively, the second transistor 241 is turned off by the forward start pulse signal STFn−1 having low voltage level. The third transistor 242 is analogous to the second transistor 241 in circuit functionality.

The first transistor 221 comprises a first end for receiving the first clock CK1, a gate end electrically connected to the second end of the second transistor 241, and a second end electrically connected to the gate line GLn. The capacitor 246 comprises a first end electrically connected to the gate end of the first transistor 221 and a second end electrically connected to the second end of the first transistor 221. The fourth transistor 231 comprises a first end for receiving the first clock CK1, a gate end electrically connected to the second end of the second transistor 241, and a second end for outputting the preliminary start pulse signal STPn. The fifth transistor 236 comprises a first end electrically connected to the second end of the fourth transistor 231 for receiving the preliminary start pulse signal STPn, a gate end for receiving the first bias Vbias1, and a second end for outputting the backward start pulse signal STBn. The sixth transistor 237 comprises a first end electrically connected to the second end of the fourth transistor 231 for receiving the preliminary start pulse signal STPn, a gate end for receiving the second bias Vbias2, and a second end for outputting the forward start pulse signal STFn. The seventh transistor 251 comprises a first end electrically connected to the first end of the capacitor 246 for receiving the driving control voltage VQn, a second end electrically connected to the gate line GLn, and a gate end for receiving the first clock CK1. The eighth transistor 252 comprises a first end for receiving the first clock CK1, a gate end electrically connected the first end, and a second end for outputting the control signal SCn. The ninth transistor 253 comprises a first end electrically connected to the second end of the eighth transistor 252, a gate end electrically connected to the second end of the seventh transistor 251, and a second end for receiving the low power voltage Vss.

The tenth transistor 261 comprises a first end electrically connected to the gate line GLn, a gate end electrically connected to the second end of the eighth transistor 252 for receiving the control signal SCn, and a second end for receiving the low power voltage Vss. The eleventh transistor 262 comprises a first end electrically connected to the gate line GLn, a gate end for receiving the second clock CK2, and a second end for receiving the low power voltage Vss. The twelfth transistor 263 comprises a first end electrically connected to the gate line GLn, a gate end for receiving the fourth clock CK4, and a second end for receiving the low power voltage Vss. The thirteenth transistor 264 comprises a first end electrically connected to the second end of the fourth transistor 231, a gate end for receiving the fourth clock CK4, and a second end for receiving the low power voltage Vss. The fourteenth transistor 271 comprises a first end electrically connected to the first end of the capacitor 246, a gate end for receiving the third clock CK3, and a second end for receiving the low power voltage Vss. The fifteenth transistor 272 comprises a first end electrically connected to the gate line GLn, a gate end for receiving the third clock CK3, and a second end for receiving the low power voltage Vss. The sixteenth transistor 273 comprises a first end electrically connected to the first end of the second transistor 241, a gate end electrically connected to the gate line GLn for receiving the gate signal SGn, and a second end for receiving the low power voltage Vss. The seventeenth transistor 274 comprises a first end electrically connected to the first end of the third transistor 242, a gate end electrically connected to the gate line GLn for receiving the gate signal SGn, and a second end for receiving the low power voltage Vss. Since each shift register stage includes corresponding pull-down mechanism for pulling down the preliminary start pulse signal generated therefrom, the sixteenth transistor 273 and the seventeenth transistor 274 can be omitted in another embodiment.

Compared with the prior-art shift register circuit, the shift register circuit 200 employs a bi-directional transmission mechanism to mitigate the mura effect on display screen so as to enhance display quality. Besides, each shift register stage pulls down the gate signal, the driving control voltage and the preliminary start pulse signal without the aid of any signal generated by a preceding or succeeding shift register stage. For that reason, the wiring layout area between adjacent shift register stages can be reduced significantly to bring the cost down. Furthermore, since the related circuit operations of each shift register stage are performed based on the first clock CK1 through the fourth clock CK4, the operating frequency of the shift register circuit 200 can be lowered for reducing power consumption and extending circuit lifetime accordingly.

Figure 3:
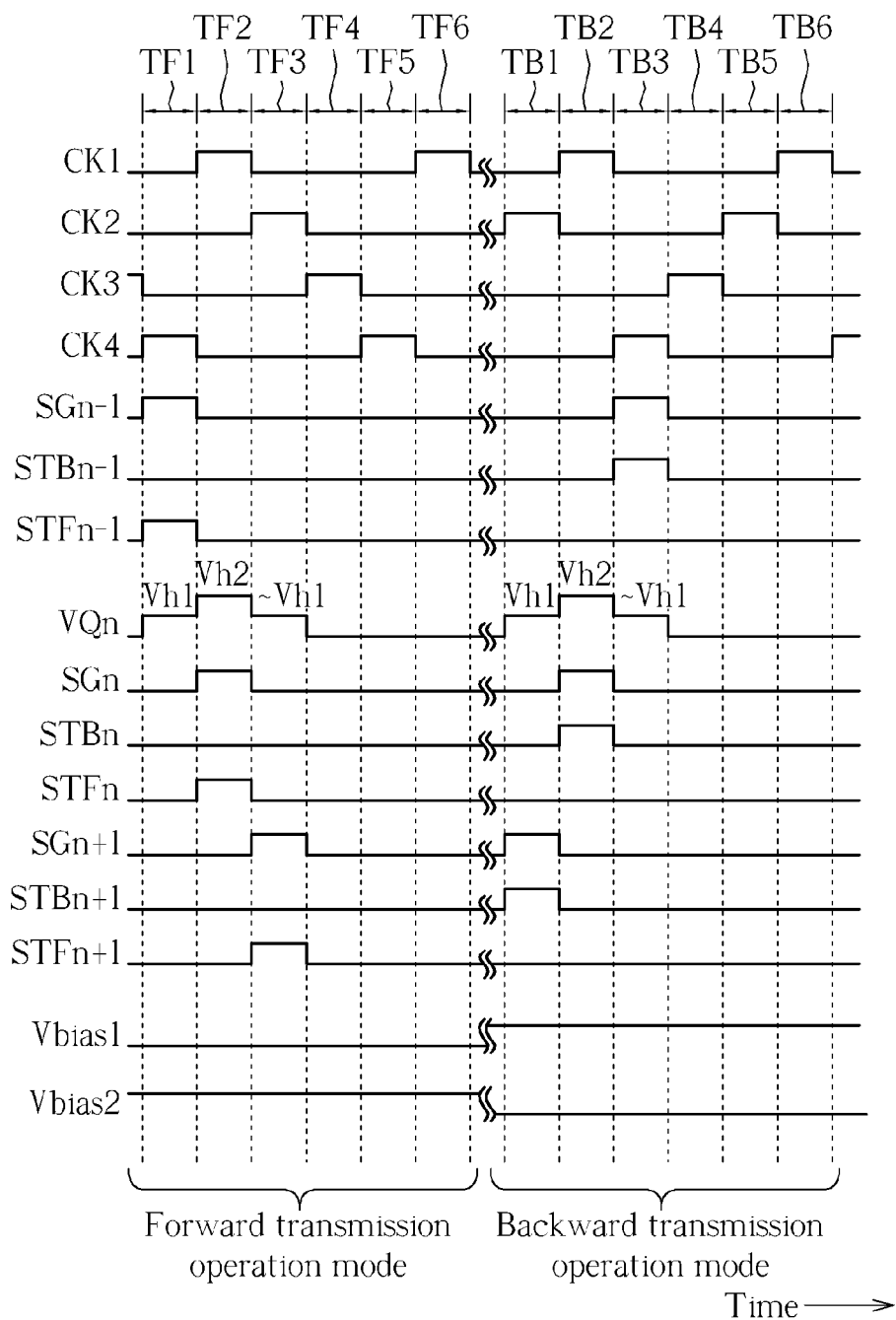
FIG. 3 is a schematic diagram showing related signal waveforms regarding the operation of the shift register circuit in FIG. 2, having time along the abscissa.

FIG. 3 is a schematic diagram showing related signal waveforms regarding the operation of the shift register circuit in FIG. 2, having time along the abscissa. The signal waveforms in FIG. 3, from top to bottom, are the first clock CK1, the second clock CK2, the third clock CK3, the fourth clock CK4, the gate signal SGn−1, the backward start pulse signal STBn−1, the forward start pulse signal STFn−1, the driving control voltage VQn, the gate signal SGn, the backward start pulse signal STBn, the forward start pulse signal STFn, the gate signal SGn+1, the backward start pulse signal STBn+1, the forward start pulse signal STFn+1, the first bias Vbias1 and the second bias Vbias2. As shown in FIG. 3, the circuit operation of the shift register circuit 200 includes a forward transmission operation mode and a backward transmission operation mode.

When the shift register circuit 200 is working in the forward transmission operation mode, the first bias Vbias1 retains a low voltage level for turning off the fifth transistor 236 and the second bias Vbias2 retains a voltage level higher than the high voltage level of clock signal for turning on the sixth transistor 237. During a forward transmission interval TF1, the gate signal SGn−1 is shifting from low voltage level to high voltage level, and therefore the forward start pulse signal STFn−1 is also shifting from low voltage level to high voltage level. Consequently, the second transistor 241 is turned on for charging the capacitor 246 so as to boost the driving control voltage VQn to a first high voltage Vh1. During a forward transmission interval TF2, the forward start pulse signal STFn−1 is falling down from high voltage level to low voltage level for turning off the second transistor 241. In the meantime, along with the switching of the first clock CK1 to high voltage level, the driving control voltage VQn is further boosted from the first high voltage Vh1 to a second high voltage Vh2 due to a capacitive coupling effect caused by the device capacitors of the first transistor 221 and the fourth transistor 231. Accordingly, the first transistor 221 and the fourth transistor 231 are turned on for pulling up the gate signal SGn and the preliminary start pulse signal STPn from low voltage level to high voltage level. The preliminary start pulse signal STPn having high voltage level is then outputted by the sixth transistor 237 to become the forward start pulse signal STFn, i.e. the forward start pulse signal STFn is switching from low voltage level to high voltage level. Besides, since the first clock CK1 also turns on the seventh transistor 251, the driving control voltage VQn and the gate signal SGn both having high voltage level are then able to turn on the ninth transistor 253 for pulling down the control signal SCn to the low power voltage Vss so as to turn off the tenth transistor 261. Further, the gate signal SGn having high voltage level is also used to turn on the sixteenth transistor 273 and the seventeenth transistor 274 for pulling down the forward start pulse signal STFn−1 and the backward start pulse signal STBn+1 to the low power voltage Vss.

During a forward transmission interval TF3, the second clock CK2 is switching to high voltage level so that the eleventh transistor 262 is turned on for pulling down the gate signal SGn to the low power voltage Vss. Along with the switching of the gate signal SGn from high voltage level to low voltage level, the driving control voltage VQn is shifting down from the second high voltage Vh2 to approximate the first high voltage Vh1 due to a capacitive coupling effect caused by the capacitor 246 and the device capacitor of the first transistor 221. In the meantime, the driving control voltage VQn continues turning on the first transistor 221 for allowing the first clock CK1 having low voltage level to assist in pulling down the gate signal SGn. Further, by making use of the forward start pulse signal STFn having high voltage level during the forward transmission interval TF2, the (N+1)th shift register stage 213 is enabled to generate the gate signal SGn+1 and the forward start pulse signal STFn+1 both having high voltage level during the forward transmission interval TF3.

During a forward transmission interval TF4, the third clock CK3 is switching to high voltage level so that both the fourteenth transistor 271 and the fifteenth transistor 272 are turned on for pulling down the driving control voltage VQn and the gate signal SGn to the low power voltage Vss. During a forward transmission interval TF5, the fourth clock CK4 is switching to high voltage level so that both the twelfth transistor 263 and the thirteenth transistor 264 are turned on for pulling down the gate signal SGn and the preliminary start pulse signal STPn to the low power voltage Vss; in turn, the forward start pulse signal STFn is pulled down to low voltage level. During a forward transmission interval TF6, the first clock CK1 is switching to high voltage level so that the eighth transistor 252 is turned on for generating the control signal SCn having high voltage level so as to turn on the tenth transistor 261, which in turn pulls down the gate signal SGn to the low power voltage Vss. Concurrently, the first clock CK1 also turns on the seventh transistor 251 for pulling down the driving control voltage VQn. Thereafter, as long as the gate signal SGn continues holding low voltage level, the first clock CK1 through the fourth clock CK4 are employed to periodically pull down the gate signal SGn, the driving control voltage VQn and the preliminary start pulse signal STPn.

When the shift register circuit 200 is working in the backward transmission operation mode, the second bias Vbias2 retains a low voltage level for turning off the sixth transistor 237 and the first bias Vbias1 retains a voltage level higher than the high voltage level of clock signal for turning on the fifth transistor 236. During a backward transmission interval TB1, the gate signal SGn+1 is shifting from low voltage level to high voltage level, and therefore the backward start pulse signal STBn+1 is also shifting from low voltage level to high voltage level. Consequently, the third transistor 242 is turned on for charging the capacitor 246 so as to boost the driving control voltage VQn to the first high voltage Vh1. During a backward transmission interval TB2, the backward start pulse signal STBn+1 is falling down from high voltage level to low voltage level for turning off the third transistor 242. In the meantime, along with the switching of the first clock CK1 to high voltage level, the driving control voltage VQn is further boosted from the first high voltage Vh1 to the second high voltage Vh2 due to a capacitive coupling effect caused by the device capacitors of the first transistor 221 and the fourth transistor 231. Accordingly, the first transistor 221 and the fourth transistor 231 are turned on for pulling up the gate signal SGn and the preliminary start pulse signal STPn from low voltage level to high voltage level. The preliminary start pulse signal STPn having high voltage level is then outputted by the fifth transistor 236 to become the backward start pulse signal STBn, i.e. the backward start pulse signal STBn is switching from low voltage level to high voltage level. Concurrently, since the first clock CK1 also turns on the seventh transistor 251, the driving control voltage VQn and the gate signal SGn both having high voltage level are then able to turn on the ninth transistor 253 for pulling down the control signal SCn to the low power voltage Vss so as to turn off the tenth transistor 261. Besides, the gate signal SGn having high voltage level turns on the sixteenth transistor 273 and the seventeenth transistor 274 for pulling down the forward start pulse signal STFn−1 and the backward start pulse signal STBn+1 to the low power voltage Vss.

During a backward transmission interval TB3, the fourth clock CK4 is switching to high voltage level so that both the twelfth transistor 263 and the thirteenth transistor 264 are turned on for pulling down the gate signal SGn and the preliminary start pulse signal STPn to the low power voltage Vss; in turn, the backward start pulse signal STBn is switching to low voltage level. Along with the switching of the gate signal SGn from high voltage level to low voltage level, the driving control voltage VQn is shifting down from the second high voltage Vh2 to approximate the first high voltage Vh1 due to a capacitive coupling effect caused by the capacitor 246 and the device capacitor of the first transistor 221. In the meantime, the driving control voltage VQn continues turning on the first transistor 221 for allowing the first clock CK1 having low voltage level to assist in pulling down the gate signal SGn. Besides, by making use of the backward start pulse signal STBn having high voltage level during the backward transmission interval TB2, the (N−1)th shift register stage 211 is enabled to generate the gate signal SGn−1 and the backward start pulse signal STBn−1 both having high voltage level during the backward transmission interval TB3.

During a backward transmission interval TB4, the third clock CK3 is switching to high voltage level so that both the fourteenth transistor 271 and the fifteenth transistor 272 are turned on for pulling down the driving control voltage VQn and the gate signal SGn to the low power voltage Vss. During a backward transmission interval TB5, the second clock CK2 is switching to high voltage level so that the eleventh transistor 262 is turned on for pulling down the gate signal SGn to the low power voltage Vss. During a backward transmission interval TB6, the first clock CK1 is switching to high voltage level so that the eighth transistor 252 is turned on for generating the control signal SCn having high voltage level so as to turn on the tenth transistor 261, which in turn pulls down the gate signal SGn to the low power voltage Vss. Concurrently, the first clock CK1 also turns on the seventh transistor 251 for pulling down the driving control voltage VQn. Thereafter, as long as the gate signal SGn continues holding low voltage level, the first clock CK1 through the fourth clock CK4 are employed to periodically pull down the gate signal SGn, the driving control voltage VQn and the preliminary start pulse signal STPn.

Figure 4:
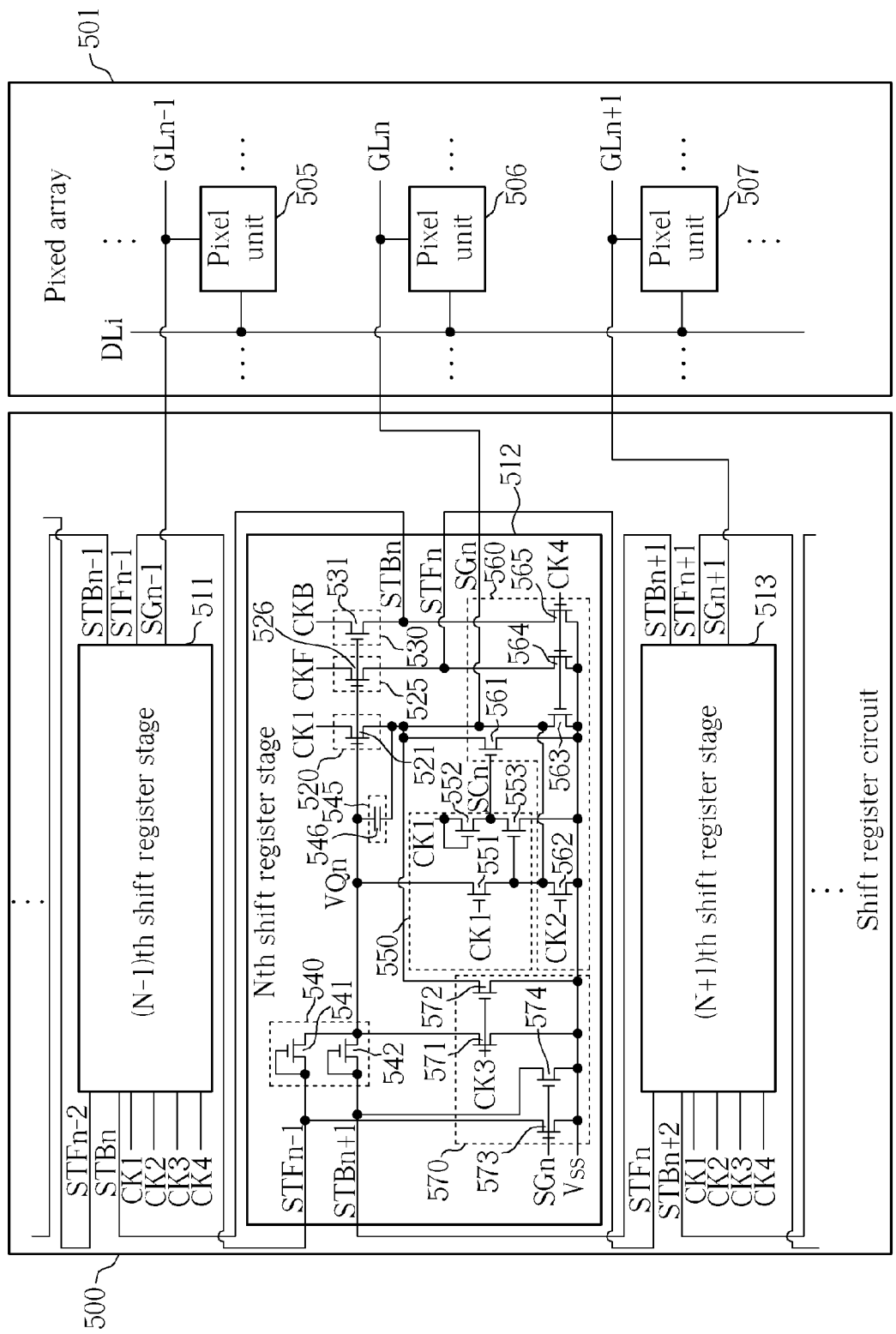
FIG. 4 is a schematic diagram showing a shift register circuit in accordance with a second embodiment of the present invention.

FIG. 4 is a schematic diagram showing a shift register circuit 500 in accordance with a second embodiment of the present invention. As shown in FIG. 4, the shift register circuit 500 comprises a plurality of shift register stages. For ease of explanation, the shift register circuit 500 illustrates an (N−1)th shift register stage 511, an Nth shift register stage 512, and an (N+1)th shift register stage 513. The number N is a positive integer. For the sake of brevity, only the internal structure of the Nth shift register stage 512 is exemplified in detail. The other shift register stages are similar to the Nth shift register stage 512 and can be inferred by analogy. The (N−1)th shift register stage 511 is employed to provide a gate signal SGn−1, a forward start pulse signal STFn−1 and a backward start pulse signal STBn−1. The Nth shift register stage 512 is employed to provide a gate signal SGn, a forward start pulse signal STFn and a backward start pulse signal STBn. The (N+1)th shift register stage 513 is employed to provide a gate signal SGn+1, a forward start pulse signal STFn+1 and a backward start pulse signal STBn+1.

The circuit operation of each shift register stage is under the control of a first clock CK1, a second clock CK2, a third clock CK3 and a fourth clock CK4. The gate signal SGn−1, furnished to the pixel unit 505 of a pixel array 501 via a gate line GLn−1, is employed to provide a control of writing a corresponding data signal of the data line DLi into the pixel unit 505. The gate signal SGn, furnished to the pixel unit 506 of the pixel array 501 via a gate line GLn, is employed to provide a control of writing a corresponding data signal of the data line DLi into the pixel unit 506. The gate signal SGn+1, furnished to the pixel unit 507 of the pixel array 501 via a gate line GLn+1, is employed to provide a control of writing a corresponding data signal of the data line DLi into the pixel unit 507. The forward start pulse signal generated by each shift register stage is employed to enable a succeeding shift register stage. The backward start pulse signal generated by each shift register stage is employed to enable a preceding shift register stage.

The Nth shift register stage 512 comprises a pull-up unit 520, an energy-store unit 545, an input unit 540, a forward carry unit 525, a backward carry unit 530, a control unit 550, a first pull-down unit 560, and a second pull-down unit 570. The pull-up unit 520 is electrically connected to the gate line GLn and functions to pull up the gate signal SGn of the gate line GLn based on a driving control voltage VQn and the first clock CK1. The input unit 540 is electrically connected to the (N−1)th shift register stage 511 and the (N+1)th shift register stage 513 for receiving the forward start pulse signal STFn−1 and the backward start pulse signal STBn+1 respectively. The input unit 540 inputs the forward start pulse signal STFn−1 having high voltage level or the backward start pulse signal STBn+1 having high voltage level to become the driving control voltage VQn. The energy-store unit 545, electrically connected to the pull-up unit 520, the input unit 540, the forward carry unit 525 and the backward carry unit 530, is utilized for providing the driving control voltage VQn to the pull-up unit 520, the forward carry unit 525 and the backward carry unit 530 through performing a charging process based on the forward start pulse signal STFn−1 or the backward start pulse signal STBn+1. The forward carry unit 525, electrically connected to the input unit 540 and the energy-store unit 545, is employed to output a first signal CKF to become the forward start pulse signal STFn according to the driving control voltage VQn. The backward carry unit 530, electrically connected to the input unit 540 and the energy-store unit 545, is employed to output a second signal CKB to become the backward start pulse signal STBn according to the driving control voltage VQn.

The control unit 550 is electrically connected to the energy-store unit 545 and functions to generate a control signal SCn according to the first clock CK1, the gate signal SGn and the driving control voltage VQn. The first pull-down unit 560, electrically connected to the control unit 550, the gate line GLn, the forward carry unit 525 and the backward carry unit 530, is used to pull down the gate signal SGn to a low power voltage Vss according to the control signal SCn, the second clock CK2 or the fourth clock CK4. The first pull-down unit 560 is also used to pull down the forward start pulse signal STFn and the backward start pulse signal STBn to the low power voltage Vss according to the fourth clock CK4. The second pull-down unit 570, electrically connected to the input unit 540 and the gate line GLn, is utilized for pulling down the driving control voltage VQn and the gate signal SGn to the low power voltage Vss according to the third clock CK3. The second pull-down unit 570 is also utilized for pulling down the forward start pulse signal STFn−1 and the backward start pulse signal STBn+1 to the low power voltage Vss according to the gate signal SGn.

In the embodiment shown in FIG. 4, the pull-up unit 520 comprises a first transistor 521, the input unit 540 comprises a second transistor 541 and a third transistor 542, the energy-store unit 545 comprises a capacitor 546, the forward carry unit 525 comprises a fourth transistor 526, the backward carry unit 530 comprises a fifth transistor 531, the control unit 550 comprises a sixth transistor 551, a seventh transistor 552 and an eighth transistor 553, the first pull-down unit 560 comprises a ninth transistor 561, a tenth transistor 562, an eleventh transistor 563, a twelfth transistor 564 and a thirteenth transistor 565, and the second pull-down unit 570 comprises a fourteenth transistor 571, a fifteenth transistor 572, a sixteenth transistor 573 and a seventeenth transistor 574. The first transistor 521 through the seventeenth transistor 574 are thin film transistors, MOS field effect transistors, or junction field effect transistors.

The second transistor 541 comprises a first end for receiving the forward start pulse signal STFn−1, a gate end electrically connected to the first end, and a second end electrically connected to the capacitor 546. The third transistor 542 comprises a first end for receiving the backward start pulse signal STBn+1, a gate end electrically connected to the first end, and a second end electrically connected to the second end of the second transistor 541. Both the circuit functionalities of the second transistor 541 and the third transistor 542 are similar to that of a diode. The first transistor 521 comprises a first end for receiving the first clock CK1, a gate end electrically connected to the second end of the second transistor 541, and a second end electrically connected to the gate line GLn. The capacitor 546 comprises a first end electrically connected to the gate end of the first transistor 521 and a second end electrically connected to the second end of the first transistor 521. The fourth transistor 526 comprises a first end for receiving the first signal CKF, a gate end electrically connected to the second end of the second transistor 541, and a second end for outputting the forward start pulse signal STFn. The fifth transistor 531 comprises a first end for receiving the second signal CKB, a gate end electrically connected to the second end of the second transistor 541, and a second end for outputting the backward start pulse signal STBn.

The sixth transistor 551 comprises a first end electrically connected to the first end of the capacitor 546 for receiving the driving control voltage VQn, a second end electrically connected to the gate line GLn, and a gate end for receiving the first clock CK1. The seventh transistor 552 comprises a first end for receiving the first clock CK1, a gate end electrically connected the first end, and a second end for outputting the control signal SCn. The eighth transistor 553 comprises a first end electrically connected to the second end of the seventh transistor 552, a gate end electrically connected to the second end of the sixth transistor 551, and a second end for receiving the low power voltage Vss.

The ninth transistor 561 comprises a first end electrically connected to the gate line GLn, a gate end electrically connected to the second end of the seventh transistor 552 for receiving the control signal SCn, and a second end for receiving the low power voltage Vss. The tenth transistor 562 comprises a first end electrically connected to the gate line GLn, a gate end for receiving the second clock CK2, and a second end for receiving the low power voltage Vss. The eleventh transistor 563 comprises a first end electrically connected to the gate line GLn, a gate end for receiving the fourth clock CK4, and a second end for receiving the low power voltage Vss. The twelfth transistor 564 comprises a first end electrically connected to the second end of the fourth transistor 526, a gate end for receiving the fourth clock CK4, and a second end for receiving the low power voltage Vss. The thirteenth transistor 565 comprises a first end electrically connected to the second end of the fifth transistor 531, a gate end for receiving the fourth clock CK4, and a second end for receiving the low power voltage Vss. The fourteenth transistor 571 comprises a first end electrically connected to the first end of the capacitor 546, a gate end for receiving the third clock CK3, and a second end for receiving the low power voltage Vss. The fifteenth transistor 572 comprises a first end electrically connected to the gate line GLn, a gate end for receiving the third clock CK3, and a second end for receiving the low power voltage Vss. The sixteenth transistor 573 comprises a first end electrically connected to the first end of the second transistor 541, a gate end electrically connected to the gate line GLn for receiving the gate signal SGn, and a second end for receiving the low power voltage Vss. The seventeenth transistor 574 comprises a first end electrically connected to the first end of the third transistor 542, a gate end electrically connected to the gate line GLn for receiving the gate signal SGn, and a second end for receiving the low power voltage Vss. Since each shift register stage includes corresponding pull-down mechanism for pulling down the backward start pulse signal and the forward start pulse signal generated therefrom, the sixteenth transistor 573 and the seventeenth transistor 574 can be omitted in another embodiment.

Compared with the prior-art shift register circuit, the shift register circuit 500 employs a bi-directional transmission mechanism to mitigate the mura effect on display screen so as to enhance display quality. Besides, each shift register stage pulls down the gate signal, the driving control voltage, the forward start pulse signal and the backward start pulse signal without the aid of any signal generated by a preceding or succeeding shift register stage. For that reason, the wiring layout area between adjacent shift register stages can be reduced significantly to bring the cost down. Furthermore, since the related circuit operations of each shift register stage are performed based on the first clock CK1 through the fourth clock CK4, the operating frequency of the shift register circuit 500 can be lowered for reducing power consumption and extending circuit lifetime accordingly.

Figure 5:
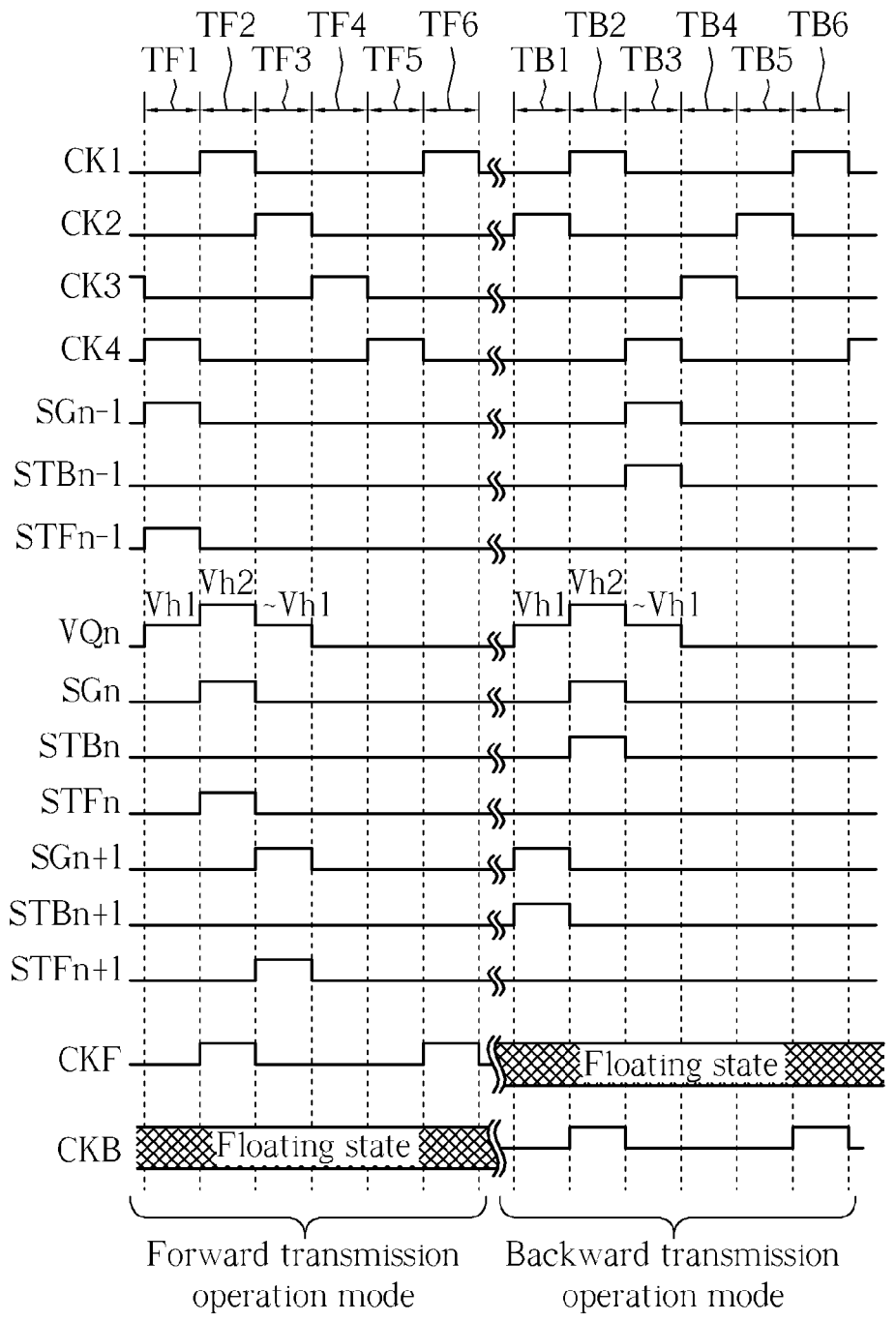
FIG. 5 is a schematic diagram showing related signal waveforms regarding the operation of the shift register circuit in FIG. 4, having time along the abscissa.

FIG. 5 is a schematic diagram showing related signal waveforms regarding the operation of the shift register circuit in FIG. 4, having time along the abscissa. The signal waveforms in FIG. 5, from top to bottom, are the first clock CK1, the second clock CK2, the third clock CK3, the fourth clock CK4, the gate signal SGn−1, the backward start pulse signal STBn−1, the forward start pulse signal STFn−1, the driving control voltage VQn, the gate signal SGn, the backward start pulse signal STBn, the forward start pulse signal STFn, the gate signal SGn+1, the backward start pulse signal STBn+1, the forward start pulse signal STFn+1, the first signal CKF and the second signal CKB. As shown in FIG. 5, the circuit operation of the shift register circuit 500 includes a forward transmission operation mode and a backward transmission operation mode.

When the shift register circuit 500 is working in the forward transmission operation mode, the first end of the fifth transistor 531 is retained to be floated or for receiving the low power voltage Vss; and the first signal CKF is substantially identical to the first clock CK1. During a forward transmission interval TF1, the gate signal SGn−1 is shifting from low voltage level to high voltage level, and therefore the forward start pulse signal STFn−1 is also shifting from low voltage level to high voltage level. Consequently, the second transistor 541 is turned on for charging the capacitor 546 so as to boost the driving control voltage VQn to a first high voltage Vh1. During a forward transmission interval TF2, the forward start pulse signal STFn−1 is falling down from high voltage level to low voltage level for turning off the second transistor 541. In the meantime, along with the switching of the first clock CK1 to high voltage level, the driving control voltage VQn is further boosted from the first high voltage Vh1 to a second high voltage Vh2 due to a capacitive coupling effect caused by the device capacitors of the first transistor 521 and the fourth transistor 526. Accordingly, the first transistor 521 and the fourth transistor 526 are turned on for pulling up the gate signal SGn and the forward start pulse signal STFn from low voltage level to high voltage level. Concurrently, since the first clock CK1 also turns on the sixth transistor 551, the driving control voltage VQn and the gate signal SGn both having high voltage level are then able to turn on the eighth transistor 553 for pulling down the control signal SCn to the low power voltage Vss so as to turn off the ninth transistor 561. Besides, the gate signal SGn having high voltage level is also used to turn on the sixteenth transistor 573 and the seventeenth transistor 574 for pulling down the forward start pulse signal STFn−1 and the backward start pulse signal STBn+1 to the low power voltage Vss.

During a forward transmission interval TF3, the second clock CK2 is switching to high voltage level so that the tenth transistor 562 is turned on for pulling down the gate signal SGn to the low power voltage Vss. Along with the switching of the gate signal SGn from high voltage level to low voltage level, the driving control voltage VQn is shifting down from the second high voltage Vh2 to approximate the first high voltage Vh1 due to a capacitive coupling effect caused by the capacitor 546 and the device capacitor of the first transistor 521. In the meantime, the driving control voltage VQn continues turning on the first transistor 521 and the fourth transistor 526 for allowing the first clock CK1 having low voltage level to assist in pulling down the gate signal SGn, and also for allowing the first signal CKF having low voltage level to assist in pulling down the forward start pulse signal STFn. Besides, by making use of the forward start pulse signal STFn having high voltage level during the forward transmission interval TF2, the (N+1)th shift register stage 513 is enabled to generate the gate signal SGn+1 and the forward start pulse signal STFn+1 both having high voltage level during the forward transmission interval TF3.

During a forward transmission interval TF4, the third clock CK3 is switching to high voltage level so that both the fourteenth transistor 571 and the fifteenth transistor 572 are turned on for pulling down the driving control voltage VQn and the gate signal SGn to the low power voltage Vss. During a forward transmission interval TF5, the fourth clock CK4 is switching to high voltage level so that all the eleventh transistor 563, the twelfth transistor 564 and the thirteenth transistor 565 are turned on for pulling down the gate signal SGn, the forward start pulse signal STFn and the backward start pulse signal STBn to the low power voltage Vss. During a forward transmission interval TF6, the first clock CK1 is switching to high voltage level so that the seventh transistor 552 is turned on for generating the control signal SCn having high voltage level so as to turn on the ninth transistor 561, which in turn pulls down the gate signal SGn to the low power voltage Vss. Concurrently, the first clock CK1 also turns on the sixth transistor 551 for pulling down the driving control voltage VQn. Thereafter, as long as the gate signal SGn continues holding low voltage level, the first clock CK1 through the fourth clock CK4 are employed to periodically pull down the gate signal SGn, the driving control voltage VQn, the forward start pulse signal STFn and the backward start pulse signal STBn.

When the shift register circuit 500 is working in the backward transmission operation mode, the first end of the fourth transistor 526 is retained to be floated or for receiving the low power voltage Vss; and the second signal CKB is substantially identical to the first clock CK1. During a backward transmission interval TB1, the gate signal SGn+1 is shifting from low voltage level to high voltage level, and therefore the backward start pulse signal STBn+1 is also shifting from low voltage level to high voltage level. Consequently, the third transistor 542 is turned on for charging the capacitor 546 so as to boost the driving control voltage VQn to the first high voltage Vh1. During a backward transmission interval TB2, the backward start pulse signal STBn+1 is falling down from high voltage level to low voltage level for turning off the third transistor 542. In the meantime, along with the switching of the first clock CK1 to high voltage level, the driving control voltage VQn is further boosted from the first high voltage Vh1 to the second high voltage Vh2 due to a capacitive coupling effect caused by the device capacitors of the first transistor 521 and the fifth transistor 531. Accordingly, the first transistor 521 and the fifth transistor 531 are turned on for pulling up the gate signal SGn and the backward start pulse signal STBn from low voltage level to high voltage level. Concurrently, since the first clock CK1 also turns on the sixth transistor 551, the driving control voltage VQn and the gate signal SGn both having high voltage level are then able to turn on the eighth transistor 553 for pulling down the control signal SCn to the low power voltage Vss so as to turn off the ninth transistor 561. Besides, the gate signal SGn having high voltage level also turns on the sixteenth transistor 573 and the seventeenth transistor 574 for pulling down the forward start pulse signal STFn−1 and the backward start pulse signal STBn+1 to the low power voltage Vss.

During a backward transmission interval TB3, the fourth clock CK4 is switching to high voltage level so that all the eleventh transistor 563, the twelfth transistor 564 and the thirteenth transistor 565 are turned on for pulling down the gate signal SGn, the forward start pulse signal STFn and the backward start pulse signal STBn to the low power voltage Vss. Along with the switching of the gate signal SGn from high voltage level to low voltage level, the driving control voltage VQn is shifting down from the second high voltage Vh2 to approximate the first high voltage Vh1 due to a capacitive coupling effect caused by the capacitor 546 and the device capacitor of the first transistor 521. In the meantime, the driving control voltage VQn continues turning on the first transistor 521 and the fifth transistor 531 for allowing the first clock CK1 having low voltage level to assist in pulling down the gate signal SGn, and also for allowing the second signal CKB having low voltage level to assist in pulling down the backward start pulse signal STBn. Besides, by making use of the backward start pulse signal STBn having high voltage level during the backward transmission interval TB2, the (N−1)th shift register stage 511 is enabled to generate the gate signal SGn−1 and the backward start pulse signal STBn−1 both having high voltage level during the backward transmission interval TB3.

During a backward transmission interval TB4, the third clock CK3 is switching to high voltage level so that both the fourteenth transistor 571 and the fifteenth transistor 572 are turned on for pulling down the driving control voltage VQn and the gate signal SGn to the low power voltage Vss. During a backward transmission interval TB5, the second clock CK2 is switching to high voltage level so that the tenth transistor 562 is turned on for pulling down the gate signal SGn to the low power voltage Vss. During a backward transmission interval TB6, the first clock CK1 is switching to high voltage level so that the seventh transistor 552 is turned on for generating the control signal SCn having high voltage level so as to turn on the ninth transistor 561, which in turn pulls down the gate signal SGn to the low power voltage Vss. Concurrently, the first clock CK1 also turns on the sixth transistor 551 for pulling down the driving control voltage VQn. Thereafter, as long as the gate signal SGn continues holding low voltage level, the first clock CK1 through the fourth clock CK4 are employed to periodically pull down the gate signal SGn, the driving control voltage VQn, the forward start pulse signal STFn and the backward start pulse signal STBn.

In summary, the shift register circuit of the present invention employs a bi-directional transmission mechanism to mitigate the mura effect on display screen so as to enhance display quality. Besides, each shift register stage pulls down the gate signal and the driving control voltage without the aid of any signal generated by a preceding or succeeding shift register stage. In view of that, the wiring layout area between adjacent shift register stages can be reduced significantly to bring the cost down. Furthermore, since the related circuit operations of each shift register stage are performed based on four clocks, the operating frequency of the shift register circuit can be lowered for reducing power consumption and extending circuit lifetime accordingly.

The present invention is by no means limited to the embodiments as described above by referring to the accompanying drawings, which may be modified and altered in a variety of different ways without departing from the scope of the present invention. Thus, it should be understood by those skilled in the art that various modifications, combinations, sub-combinations and alternations might occur depending on design requirements and other factors insofar as they are within the scope of the appended claims or the equivalents thereof.

What is claimed is:

1. A shift register circuit for providing plural gate signals to plural gate lines, the shift register circuit comprising a plurality of shift register stages, an Nth shift register stage of the shift register stages comprising:

a pull-up unit, electrically connected to an Nth gate line of the gate lines, for pulling up an Nth gate signal of the gate signals according to a driving control voltage and a first clock, wherein the Nth gate line is employed to deliver the Nth gate signal;

a carry unit for generating a preliminary start pulse signal according to the driving control voltage and the first clock;

a carry control unit, electrically connected to the carry unit for receiving the preliminary start pulse signal, for outputting the preliminary start pulse signal to become the an Nth forward start pulse signal or an Nth backward start pulse signal according to a first bias and a second bias;

an input unit, electrically connected to an (N−1)th shift register stage and an (N+1)th shift register stage of the shift register stages for receiving an (N−1)th forward start pulse signal and an (N+1)th backward start pulse signal respectively, for inputting the (N−1)th forward start pulse signal having high voltage level or the (N+1)th backward start pulse signal having high voltage level to become the driving control voltage;

a control unit for generating a control signal according to the first clock, the Nth gate signal and the driving control voltage;

a first pull-down unit, electrically connected to the control unit, the Nth gate line and the carry unit, for pulling down the Nth gate signal according to the control signal, a second clock, or a fourth clock, and for pulling down the preliminary start pulse signal according to the fourth clock; and a second pull-down unit, electrically connected to the input unit and the Nth gate line, for pulling down the driving control voltage and the Nth gate signal according to a third clock;

wherein N is a positive integer.

2. The shift register circuit of claim 1, further comprising:

an energy-store unit, electrically connected to the pull-up unit, the input unit and the carry unit, for providing the driving control voltage to the pull-up unit and the carry unit through performing a charging process based on the (N−1)th forward start pulse signal or the (N+1)th backward start pulse signal.

3. The shift register circuit of claim 2, wherein the energy-store unit comprises a capacitor for performing the charging process and storing the driving control voltage.

4. The shift register circuit of claim 1, wherein the input unit comprises:

a first transistor comprising:
a first end electrically connected to the (N−1)th shift register stage for receiving the (N−1)th forward start pulse signal;
a gate end electrically connected to the first end of the first transistor; and
a second end electrically connected to the pull-up unit and the carry unit; and a second transistor comprising:
a first end electrically connected to the (N+1)th shift register stage for receiving the (N+1)th backward start pulse signal;
a gate end electrically connected to the first end of the second transistor; and
a second end electrically connected to the second end of the first transistor.

5. The shift register circuit of claim 1, wherein the pull-up unit comprises a transistor, the transistor comprising:
a first end for receiving the first clock;
a gate end electrically connected to the input unit for receiving the driving control voltage; and
a second end electrically connected to the Nth gate line.

6. The shift register circuit of claim 1, wherein the carry unit comprises a transistor, the transistor comprising:
a first end for receiving the first clock;
a gate end electrically connected to the input unit for receiving the driving control voltage; and
a second end, electrically connected to the carry control unit, for outputting the preliminary start pulse signal.

7. The shift register circuit of claim 1, wherein the carry control unit comprises:
a first transistor comprising:
a first end electrically connected to the carry unit for receiving the preliminary start pulse signal;
a gate end for receiving the first bias; and
a second end for outputting the Nth forward start pulse signal; and
a second transistor comprising:
a first end electrically connected to the carry unit for receiving the preliminary start pulse signal;
a gate end for receiving the second bias; and
a second end for outputting the Nth backward start pulse signal.

8. The shift register circuit of claim 1, wherein the control unit comprises:
a first transistor comprising:
a first end electrically connected to the input unit for receiving the driving control voltage;
a gate end for receiving the first clock; and
a second end electrically connected to the Nth gate line;
a second transistor comprising:
a first end for receiving the first clock;
a gate end electrically connected to the first end of the second transistor; and
a second end for outputting the control signal; and
a third transistor comprising:
a first end electrically connected to the second end of the second transistor;
a gate end electrically connected to the second end of the first transistor; and
a second end for receiving a low power voltage.

9. The shift register circuit of claim 1, wherein the first pull-down unit comprises:
a first transistor comprising:
a first end electrically connected to the Nth gate line;
a gate end electrically connected to the control unit for receiving the control signal; and
a second end for receiving a low power voltage;
a second transistor comprising:
a first end electrically connected to the Nth gate line;
a gate end for receiving the second clock; and
a second end for receiving the low power voltage;
a third transistor comprising:
a first end electrically connected to the Nth gate line;
a gate end for receiving the fourth clock; and
a second end for receiving the low power voltage; and
a fourth transistor comprising:
a first end electrically connected to the carry unit for receiving the preliminary start pulse signal;
a gate end for receiving the fourth clock; and
a second end for receiving the low power voltage.

10. The shift register circuit of claim 1, wherein the second pull-down unit is further employed to pull down the (N−1)th forward start pulse signal and the (N+1)th backward start pulse signal according to the Nth gate signal.

11. The shift register circuit of claim 10, wherein the second pull-down unit comprises:
a first transistor comprising:
a first end electrically connected to the input unit for receiving the driving control voltage;
a gate end for receiving the third clock; and
a second end for receiving a low power voltage;
a second transistor comprising:
a first end electrically connected to the Nth gate line;
a gate end for receiving the third clock; and
a second end for receiving the low power voltage;
a third transistor comprising:
a first end for receiving the (N−1)th forward start pulse signal;
a gate end electrically connected to the Nth gate line for receiving the Nth gate signal; and
a second end for receiving the low power voltage; and
a fourth transistor comprising:
a first end for receiving the (N+1)th backward start pulse signal;
a gate end electrically connected to the Nth gate line for receiving the Nth gate signal; and
a second end for receiving the low power voltage.

12. A shift register circuit for providing plural gate signals to plural gate lines, the shift register circuit comprising a plurality of shift register stages, an Nth shift register stage of the shift register stages comprising:
a pull-up unit, electrically connected to an Nth gate line of the gate lines, for pulling up an Nth gate signal of the gate signals according to a driving control voltage and a first clock, wherein the Nth gate line is employed to deliver the Nth gate signal;
a forward carry unit for outputting a first signal to become an Nth forward start pulse signal according to the driving control voltage;
a backward carry unit for outputting a second signal to become an Nth backward start pulse signal according to the driving control voltage;
an input unit, electrically connected to an (N−1)th shift register stage and an (N+1)th shift register stage of the shift register stages for receiving an (N−1)th forward start pulse signal and an (N+1)th backward start pulse signal respectively, for inputting the (N−1)th forward start pulse signal having high voltage level or the (N+1)th backward start pulse signal having high voltage level to become the driving control voltage;
a control unit for generating a control signal according to the first clock, the Nth gate signal and the driving control voltage;
a first pull-down unit, electrically connected to the control unit, the Nth gate line, the forward carry unit and the backward carry unit, for pulling down the Nth gate signal according to the control signal, a second clock, or a fourth clock, and for pulling down the Nth forward start pulse signal and the Nth backward start pulse signal according to the fourth clock; and
a second pull-down unit, electrically connected to the input unit and the Nth gate line, for pulling down the driving control voltage and the Nth gate signal according to a third clock;
wherein N is a positive integer.

13. The shift register circuit of claim 12, further comprising:
an energy-store unit, electrically connected to the pull-up unit, the input unit, the forward carry unit and the backward carry unit, for providing the driving control voltage to the pull-up unit, the forward carry unit and the backward carry unit through performing a charging process based on the (N−1)th forward start pulse signal or the (N+1)th backward start pulse signal.

14. The shift register circuit of claim 13, wherein the energy-store unit comprises a capacitor for performing the charging process and storing the driving control voltage.

15. The shift register circuit of claim 12, wherein the input unit comprises:
a first transistor comprising:
a first end electrically connected to the (N−1)th shift register stage for receiving the (N−1)th forward start pulse signal;
a gate end electrically connected to the first end of the first transistor; and
a second end electrically connected to the pull-up unit, the forward carry unit and the backward carry unit; and
a second transistor comprising:
a first end electrically connected to the (N+1)th shift register stage for receiving the (N+1)th backward start pulse signal;
a gate end electrically connected to the first end of the second transistor; and
a second end electrically connected to the second end of the first transistor.

16. The shift register circuit of claim 12, wherein the pull-up unit comprises a transistor, the transistor comprising:
a first end for receiving the first clock;
a gate end electrically connected to the input unit for receiving the driving control voltage; and
a second end electrically connected to the Nth gate line.

17. The shift register circuit of claim 12, wherein the forward carry unit comprises a transistor, the transistor comprising:
a first end for receiving the first signal;
a gate end electrically connected to the input unit for receiving the driving control voltage; and
a second end for outputting the Nth forward start pulse signal;
wherein the first signal is substantially identical to the first clock when the shift register circuit performs a forward transmission operation, and the first signal is a floating signal or a low power voltage when the shift register circuit performs a backward transmission operation.

18. The shift register circuit of claim 12, wherein the backward carry unit comprises a transistor, the transistor comprising:
a first end for receiving the second signal;
a gate end electrically connected to the input unit for receiving the driving control voltage; and
a second end for outputting the Nth backward start pulse signal;
wherein the second signal is substantially identical to the first clock when the shift register circuit performs a backward transmission operation, and the second signal is a floating signal or a low power voltage when the shift register circuit performs a forward transmission operation.

19. The shift register circuit of claim 12, wherein the control unit comprises:
a first transistor comprising:
a first end electrically connected to the input unit for receiving the driving control voltage;

a gate end for receiving the first clock; and
a second end electrically connected to the Nth gate line;
a second transistor comprising:
a first end for receiving the first clock;
a gate end electrically connected to the first end of the second transistor; and
a second end for outputting the control signal; and
a third transistor comprising:
a first end electrically connected to the second end of the second transistor;
a gate end electrically connected to the second end of the first transistor; and
a second end for receiving a low power voltage.

20. The shift register circuit of claim 12, wherein the first pull-down unit comprises:
a first transistor comprising:
a first end electrically connected to the Nth gate line;
a gate end electrically connected to the control unit for receiving the control signal; and
a second end for receiving a low power voltage;
a second transistor comprising:
a first end electrically connected to the Nth gate line;
a gate end for receiving the second clock; and
a second end for receiving the low power voltage;
a third transistor comprising:
a first end electrically connected to the Nth gate line;
a gate end for receiving the fourth clock; and
a second end for receiving the low power voltage;
a fourth transistor comprising:
a first end electrically connected to the forward carry unit for receiving the Nth forward start pulse signal;
a gate end for receiving the fourth clock; and
a second end for receiving the low power voltage; and
a fifth transistor comprising:
a first end electrically connected to the backward carry unit for receiving the Nth backward start pulse signal;
a gate end for receiving the fourth clock; and
a second end for receiving the low power voltage.

21. The shift register circuit of claim 12, wherein the second pull-down unit is further employed to pull down the (N−1)th forward start pulse signal and the (N+1)th backward start pulse signal according to the Nth gate signal.

22. The shift register circuit of claim 21, wherein the second pull-down unit comprises:
a first transistor comprising:
a first end electrically connected to the input unit for receiving the driving control voltage;
a gate end for receiving the third clock; and
a second end for receiving a low power voltage;
a second transistor comprising:
a first end electrically connected to the Nth gate line;
a gate end for receiving the third clock; and
a second end for receiving the low power voltage;
a third transistor comprising:
a first end for receiving the (N−1)th forward start pulse signal;
a gate end electrically connected to the Nth gate line for receiving the Nth gate signal; and
a second end for receiving the low power voltage; and
a fourth transistor comprising:
a first end for receiving the (N+1)th backward start pulse signal;
a gate end electrically connected to the Nth gate line for receiving the Nth gate signal; and
a second end for receiving the low power voltage.

* * * * *